(12) United States Patent
Lin

(10) Patent No.: US 11,788,204 B2
(45) Date of Patent: Oct. 17, 2023

(54) SILICON CARBIDE WAFER AND METHOD OF FABRICATING THE SAME

(71) Applicant: GlobalWafers Co., Ltd., Hsinchu (TW)

(72) Inventor: Ching-Shan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 234 days.

(21) Appl. No.: 17/385,929

(22) Filed: Jul. 27, 2021

(65) Prior Publication Data

US 2022/0049374 A1    Feb. 17, 2022

Related U.S. Application Data

(60) Provisional application No. 63/066,330, filed on Aug. 17, 2020.

(51) Int. Cl.
*C30B 29/36* (2006.01)
*C30B 23/02* (2006.01)

(52) U.S. Cl.
CPC .............. *C30B 29/36* (2013.01); *C30B 23/02* (2013.01)

(58) Field of Classification Search
CPC ................................ C30B 29/36; C30B 23/02
See application file for complete search history.

(56) References Cited

U.S. PATENT DOCUMENTS

2016/0160386 A1* 6/2016 Masuda .................. C01B 32/97
428/402

FOREIGN PATENT DOCUMENTS

| CN | 109280976 | 1/2019 |
| JP | 6046405 | 12/2016 |
| JP | 2019127415 | 8/2019 |
| TW | 200632154 | 9/2006 |
| WO | 2010111473 | 9/2010 |

OTHER PUBLICATIONS

"Office Action of Taiwan Counterpart Application", dated Apr. 13, 2022, p. 1-p. 5.

* cited by examiner

*Primary Examiner* — Elizabeth E Mulvaney
(74) *Attorney, Agent, or Firm* — JCIPRNET

(57) ABSTRACT

A silicon carbide wafer is provided, wherein within a range area of 5 mm from an edge of the silicon carbide wafer, there are no low angle grain boundaries formed by clustering of basal plane dislocation defects, and the silicon carbide wafer has a bowing of less than 15 µm.

12 Claims, 3 Drawing Sheets
(2 of 3 Drawing Sheet(s) Filed in Color)

Warp = 60.5um
bow = 39.5um

Warp = 28.7um
bow = 12.5um

Warp = 15.5um
bow = 3.5um

Warp = 20.5um
bow = 9.2um

Warp = 25.5um
bow = 10.5um

SILICON CARBIDE WAFER AND METHOD OF FABRICATING THE SAME

CROSS-REFERENCE TO RELATED APPLICATION

This application claims the priority benefit of U.S. Provisional Application No. 63/066,330, filed on Aug. 17, 2020. The entirety of the above-mentioned patent application is hereby incorporated by reference herein and made a part of this specification.

BACKGROUND

Technical Field

The invention relates to a silicon carbide wafer, and particularly relates to a silicon carbide wafer with high flatness and a method of fabricating the same.

Description of Related Art

Silicon carbide wafers are generally formed by forming a crystal/ingot from a seed crystal through a crystal growth process, and then slicing the crystal/ingot to form the silicon carbide wafers. If a surface of the used seed crystal is uneven, or damaged or has basal plane dislocation (BPD) defects, it may easily lead to different crystal growth directions to result in more defects. If the BPD defects of the grown crystal are clustered in strips to form low angle grain boundaries, it may cause strain stress to be unable to disperse. Generally, the low angle grain boundary refers to that an interface between sub-grains with slightly different phase differences within the grains is composed of adjacent grains with a phase difference of less than 15°.

Through experiments of the inventor, it has been found that after the crystals with the low angle grain boundaries are sliced and processed, a geometric appearance of the obtained silicon carbide wafer will become larger, for example, a warping and bowing of the wafer tend to be as large as 50 μm or more. Therefore, how to control the BPD defects to reduce or avoid generation of the low angle grain boundaries and provide silicon carbide wafers with high flatness are currently urgent problems to be solved.

SUMMARY

The invention is directed to a silicon carbide wafer and a method of fabricating the same, which is adapted to fabricate a silicon carbide wafer with only a small amount of or no low angle grain boundaries, so that the wafer may still achieve high flatness after processing.

The invention provides a silicon carbide wafer. Within a range area of 5 mm from an edge of the silicon carbide wafer, there are no low angle grain boundaries formed by clustering of basal plane dislocation defects, and the silicon carbide wafer has a bowing of less than 15 μm.

In an embodiment of the invention, a warping of the silicon carbide wafer after the grinding and polishing is less than 30 μm.

In an embodiment of the invention, within a range area of 10 mm from the edge of the silicon carbide wafer, the low angle grain boundaries formed by clustering of the basal plane dislocation defects are less than 7% of the range area.

In an embodiment of the invention, within the range area of 10 mm from the edge of the silicon carbide wafer, there are no low angle grain boundaries formed by clustering of the basal plane dislocation defects.

In an embodiment of the invention, within a range area of 15 mm from the edge of the silicon carbide wafer, the low angle grain boundaries formed by clustering of the basal plane dislocation defects are less than 10% of the range area.

In an embodiment of the invention, within the range area of 15 mm from the edge of the silicon carbide wafer, there are no low angle grain boundaries formed by clustering of the basal plane dislocation defects.

In an embodiment of the invention, within a range area of 20 mm from the edge of the silicon carbide wafer, the low angle grain boundaries formed by clustering of the basal plane dislocation defects are less than 30% of the range area.

In an embodiment of the invention, within the range area of 20 mm from the edge of the silicon carbide wafer, the low angle grain boundaries formed by clustering of the basal plane dislocation defects are less than 20% of the range area.

In an embodiment of the invention, within the range area of 20 mm from the edge of the silicon carbide wafer, there are no low angle grain boundaries formed by clustering of the basal plane dislocation defects.

In an embodiment of the invention, a density of the basal plane dislocation defects in the silicon carbide wafer is 210 ea/cm$^2$ to 450 ea/cm$^2$.

The invention further provides a method of fabricating a silicon carbide wafer, which includes following steps. A seed crystal is provided. The seed crystal includes a first surface and a second surface opposite to the first surface. A raw material of silicon carbide powder is used to contact the seed crystal to perform a crystal growth process. Impurity in the silicon carbide powder is less than 0.5 ppm. A crystal is formed through the crystal growth process, and the crystal is sliced to form the silicon carbide wafer.

In an embodiment of the invention, a difference between numbers of basal plane dislocation defects of the first surface and the second surface in the seed crystal is less than 25%.

Based on the above description, the silicon carbide wafer formed according to the method of the embodiment of the invention may control the silicon carbide wafer to have no low angle grain boundaries within a specific range area. Accordingly, after the silicon carbide wafer of the invention is ground, polished, etc., a bowing and a warping thereof may all be controlled within an ideal range to achieve the silicon carbide wafer with high flatness.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
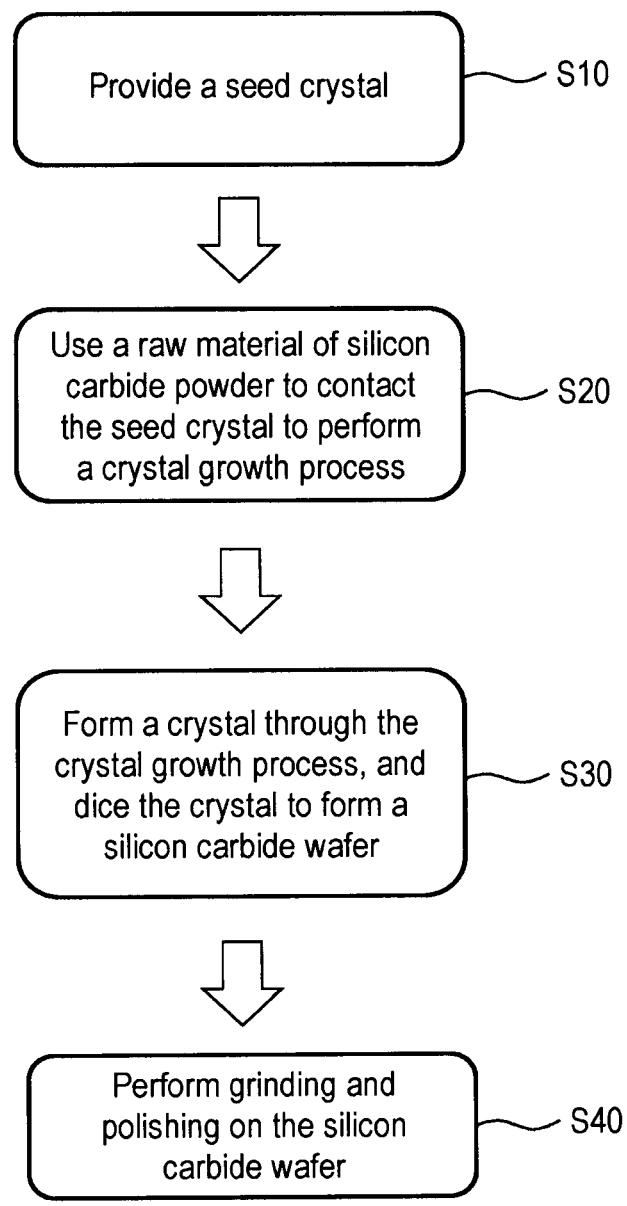
FIG. 1 is a flowchart of a method for fabricating a silicon carbide wafer according to an embodiment of the invention.

FIG. 1 is a flowchart of a method for fabricating a silicon carbide wafer according to an embodiment of the invention. As shown in FIG. 1, a seed crystal is provided in step S10. The seed crystal includes a first surface and a second surface opposite to the first surface. For example, the first surface may be a carbon surface, and the second surface may be a silicon surface. In the embodiment of the invention, a difference between a number of basal plane dislocation (BPD) defects in the first surface and a number of BPD defects in the second surface is less than 25%. In some embodiments, the difference between the number of the BPD defects in the first surface and the number of the BPD defects in the second surface is 20% or less. In other words, defect distributions on the first surface and the second surface are similar, and the difference is the smaller the better. When BPD defects of the first surface and the second surface of the seed crystal are controlled to be within the above range, since it is not easy to deform the BPD defects due to thermal stress during crystal growth, thereby deteriorating the seed crystal, generation of low angle grain boundaries may be reduced or avoided.

In addition, in some embodiments, a local thickness variation (LTV) and a stacking fault (SF) difference between the first surface and the second surface of the seed crystal are also the smaller the better. For example, the LTV on both surfaces of the seed crystal may be controlled to be less than 1.0 μm, and the SF may be controlled to be less than 10 ea/cm$^2$. Accordingly, generation of the low angle grain boundaries may be further reduced or avoided.

In the embodiment of the invention, the seed crystal is placed in a high-temperature furnace, and silicon carbide powder is used as a solid evaporation source that is placed at the bottom of the high-temperature furnace, and the high-temperature furnace is heated by an induction coil. As shown in step S20 of FIG. 1, a raw material of the silicon carbide powder is used to contact the seed crystal to perform the crystal growth process. In some embodiments, the impurity in the silicon carbide powder is less than 0.5 ppm. Namely, detectable impurity elements of all metals in the silicon carbide powder are less than 0.5 ppm.

During the crystal growth process, the raw material of the silicon carbide powder may be sublimated in a thermal field of the high-temperature furnace, and a radial temperature gradient of the thermal field is less than 50° C./cm. In other words, the seed crystal may accept the re-solidified raw material (the silicon carbide powder) transported in a gaseous state, and slowly form a semiconductor material on the surface of the seed crystal until a crystal/ingot of a desired size is obtained. Crystals/ingots may have different crystal structures depending on a manufacturing method, manufacturing materials, and crystal orientation of the seed crystal. For example, ingots of silicon carbide include 4H-silicon carbide, 6H-silicon carbide, etc. 4H-silicon carbide and 6H-silicon carbide belong to a hexagonal crystal system.

Then, as shown in step S30 of FIG. 1, after the crystal/ingot is formed through the crystal growth process, the crystal/ingot is sliced to form a silicon carbide wafer. For example, in some embodiments, sides and corners of the crystal are sliced to obtain an equal-diameter cylinder, which is then ground into round corners to prevent sides and corners of the wafer from being broken due to collision.

Then, the crystal is sliced to obtain a plurality of wafers. The slicing method of the crystal 100 includes slicing with a knife or a steel wire in collaboration with abrasive particles (abrasive particles such as diamond particles).

In the embodiment of the invention, in the silicon carbide wafer formed after slicing, within a range area of 5 mm from an edge of the silicon carbide wafer, there are no low angle grain boundaries formed by clustering of BPD defects. In some embodiments, within a range area of 10 mm from the edge of the silicon carbide wafer, the low angle grain boundaries formed by clustering of the BPD defects are less than 7% of the range area. In some embodiments, within the range area of 10 mm from the edge of the silicon carbide wafer, there are no low angle grain boundaries formed by clustering of the BPD defects. In some embodiments, within a range area of 15 mm from the edge of the silicon carbide wafer, the low angle grain boundaries formed by clustering of the BPD defects are less than 10% of the range area. In some embodiments, within the range area of 15 mm from the edge of the silicon carbide wafer, there are no low angle grain boundaries formed by clustering of the BPD defects. In some embodiments, within a range area of 20 mm from the edge of the silicon carbide wafer, the low angle grain boundaries formed by clustering of the BPD defects are less than 30% of the range area. In some embodiments, within the range area of 20 mm from the edge of the silicon carbide wafer, the low angle grain boundaries formed by clustering of the BPD defects are less than 20% of the range area. In some embodiments, within the range area of 20 mm from the edge of the silicon carbide wafer, there are no low angle grain boundaries formed by clustering of the BPD defects.

In some embodiments, the crystal formed by the crystal growth process and the wafer obtained after slicing may meet at least one of group conditions in table 1 below:

TABLE 1

| Group | 1 | 2 | 3 | 4 | 5 |
|---|---|---|---|---|---|
| Percentage of low angle grain boundaries within a range area of 5 mm from the edge of the silicon carbide wafer | None | None | None | None | None |
| Percentage of low angle grain boundaries within a range area of 10 mm from the edge of the silicon carbide wafer | None | None | None | Less than 5% | Less than 7% |
| Percentage of low angle grain boundaries within a range area of 15 mm from the edge of the silicon carbide wafer | None | None | Less than 5% | Less than 7% | Less than 10% |
| Percentage of low angle grain boundaries within a range area of 20 mm from the edge of the silicon carbide wafer | None | Less than 10% | Less than 15% | Less than 20% | Less than 30% |

Then, as shown in step S40 in FIG. 1, processing such as grinding, polishing, etc., are performed on the silicon carbide wafer obtained after slicing. In the embodiment of the invention, when a proportion of the low angle grain boundaries in the silicon carbide wafer meets the above conditions, a bowing of the silicon carbide wafer after grinding and polishing may be less than 15 μm, and a warping of the silicon carbide wafer after grinding and polishing may be less than 30 μm.

In order to prove that the method of fabricating the silicon carbide wafer of the invention may reduce the low angle grain boundaries, and control the bowing and the warping of the processed wafer within certain ranges, a comparative example and an experimental example are provided below for further description.

Comparative Example

In the comparative example, the crystal growth process is performed by using a seed crystal with a difference between the numbers of the BPD defects on the first surface and the second surface of the seed crystal more than 25% and a raw material with an impurity content of more than 0.5 ppm in the silicon carbide powder. After slicing the crystal obtained in the comparative example to obtain a wafer, a wafer defect inspection device Lasertec SICA 88 is used to measure the wafer, and the experimental results are shown in FIG. 2A to FIG. 2C.

Figure 2C:
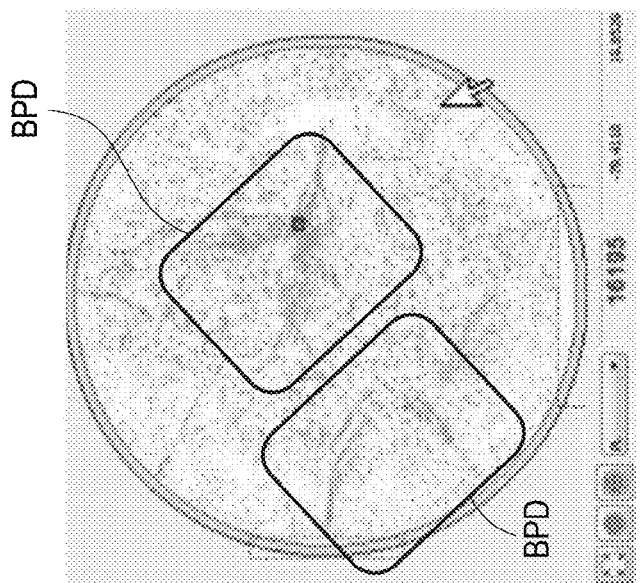
FIG. 2A to FIG. 2C are measurement results of silicon carbide wafers measured by a wafer defect inspection device according to some comparative examples of the invention.
Figure 2B:
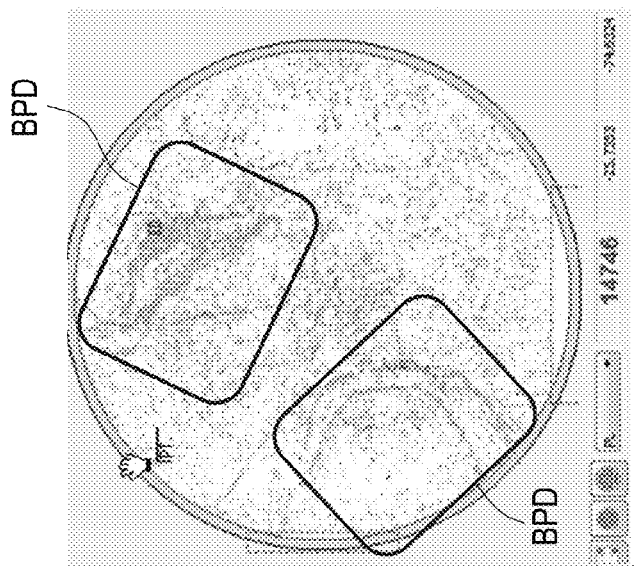
Figure 2A:
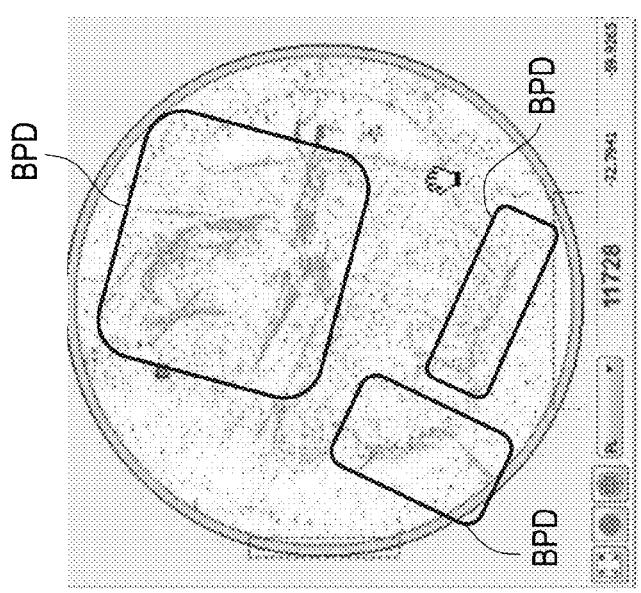

FIG. 2A to FIG. 2C are measurement results of silicon carbide wafers measured by a wafer defect inspection device according to some comparative examples of the invention. As shown in FIG. 2A to FIG. 2C, according to the measurement results measured by the wafer defect inspection device, it is found that the silicon carbide wafer in each comparative example have obvious strip-shaped low angle grain boundaries formed by clustering of the basal plane dislocation defects BPD. In addition, after processing the silicon carbide wafers in FIG. 2A to FIG. 2C, the bowing and warping values thereof are both high. As shown in the comparative example of FIG. 2A, the bowing of the silicon carbide wafer is 39.5 μm and the warping is 60.5 μm. As shown in the comparative example of FIG. 2B, the bowing of the silicon carbide wafer is 49.5 μm and the warping is 90.5 μm. As shown in the comparative example of FIG. 2C, the bowing of the silicon carbide wafer is 79.5 μm and the warping is 105.5 μm. Accordingly, the silicon carbide wafers obtained according to the comparative example cannot meet the requirements of the silicon carbide wafer of the invention that the bowing of the silicon carbide wafer after grinding and polishing is less than 15 μm and the warping is less than 30 μm.

Experimental Example

In the experimental example, the crystal growth process is performed by using a seed crystal with a difference between the numbers of the BPD defects on the first surface and the second surface of the seed crystal less than 25% and a raw material with an impurity content of less than 0.5 ppm in the silicon carbide powder. After slicing the crystal obtained in the experimental example to obtain a wafer, the wafer defect inspection device Lasertec SICA 88, a photoluminescence fluorescence spectrum or other optical device is used to measure the wafer, and the experimental results are shown in FIG. 3A to FIG. 3D.

FIG. 3A to FIG. 3D are measurement results of silicon carbide wafers measured by a wafer defect inspection device according to some embodiments of the invention. As shown in FIG. 3A to FIG. 3D, according to the measurement results measured by the wafer defect inspection device, it is found that the silicon carbide wafer in each comparative example does not have obvious low angle grain boundaries formed by clustering of the basal plane dislocation defects BPD. In addition, after processing the silicon carbide wafers in FIG. 3A to FIG. 3D, the bowing and warping values thereof all meet the requirements that the silicon carbide wafer of the invention has bowing of less than 15 μm and warping of less than 30 μm after being ground and polished.

Figure 3A:
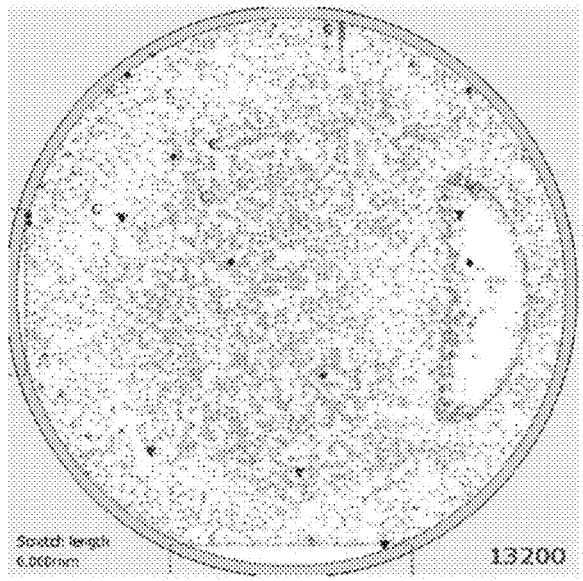
FIG. 3A to FIG. 3D are measurement results of silicon carbide wafers measured by a wafer defect inspection device according to some embodiments of the invention.
Figure 3B:
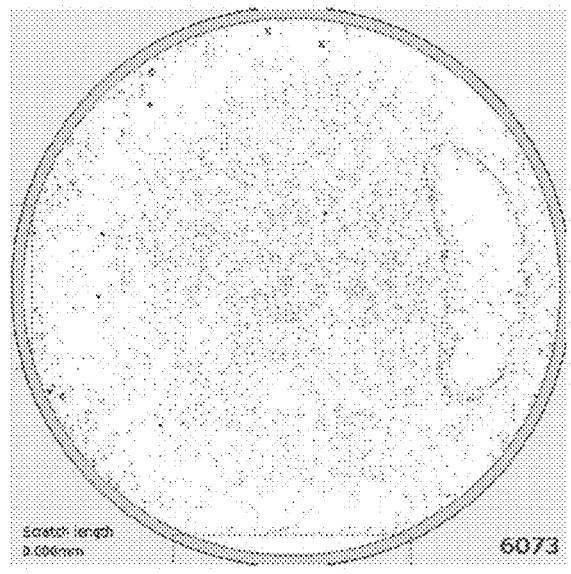
Figure 3C:
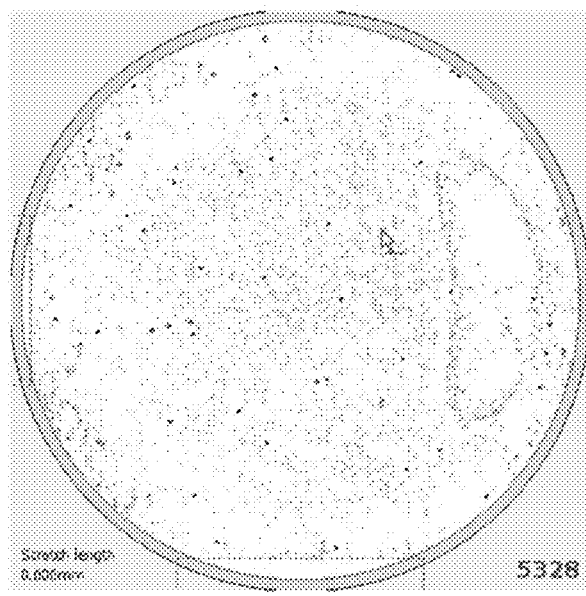
Figure 3D:
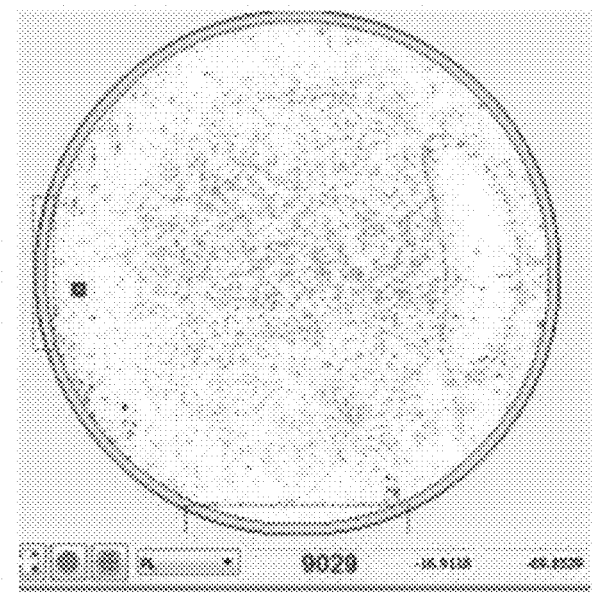

As shown in the experimental example of FIG. 3A, the bowing of the silicon carbide wafer is 12.5 μm and the warping is 28.7 μm. As shown in the experimental example of FIG. 3B, the bowing of the silicon carbide wafer is 3.5 μm and the warping is 15.5 μm. As shown in the experimental example of FIG. 3C, the bowing of the silicon carbide wafer is 9.2 μm and the warping is 20.4 μm. As shown in the experimental example of FIG. 3D, the bowing of the silicon carbide wafer is 10.5 μm and the warping is 25.5 μm. In addition, in the experimental examples shown in FIG. 3A to FIG. 3D, when the photoluminescence function of the wafer defect inspection device Lasertec SICA 88 is used to measure the wafer, it may be confirmed that a density of the basal plane dislocation defects in the silicon carbide wafer is 210 ea/cm$^2$ to 450 ea/cm$^2$. When the density in the silicon carbide wafer falls within the above range, it may be expected that the basal plane dislocation defects BPD will not cluster to form the low angle grain boundaries. Accordingly, the silicon carbide wafer obtained by the embodiment of the invention may have ideal flatness.

In summary, the silicon carbide wafer formed according to the method of the embodiment of the invention may control the silicon carbide wafer to have no low angle grain boundaries within a specific range area. Accordingly, after the silicon carbide wafer of the invention is ground, polished, etc., a bowing and a warping thereof may all be controlled within an ideal range to achieve the silicon carbide wafer with high flatness.

What is claimed is:

1. A silicon carbide wafer, wherein within a range area of 5 mm from an edge of the silicon carbide wafer, there are no low angle grain boundaries formed by clustering of basal plane dislocation defects, and the silicon carbide wafer has a bowing of less than 15 μm.

2. The silicon carbide wafer as claimed in claim 1, wherein the silicon carbide wafer has a warping of less than 30 μm.

3. The silicon carbide wafer as claimed in claim 1, wherein within a range area of 10 mm from the edge of the silicon carbide wafer, the low angle grain boundaries formed by the clustering of the basal plane dislocation defects are less than 7% of the range area.

4. The silicon carbide wafer as claimed in claim 3, wherein within the range area of 10 mm from the edge of the silicon carbide wafer, there are no low angle grain boundaries formed by the clustering of the basal plane dislocation defects.

5. The silicon carbide wafer as claimed in claim 1, wherein within a range area of 15 mm from the edge of the silicon carbide wafer, the low angle grain boundaries formed by the clustering of the basal plane dislocation defects are less than 10% of the range area.

6. The silicon carbide wafer as claimed in claim 5, wherein within the range area of 15 mm from the edge of the silicon carbide wafer, there are no low angle grain boundaries formed by the clustering of the basal plane dislocation defects.

7. The silicon carbide wafer as claimed in claim 1, wherein within a range area of 20 mm from the edge of the silicon carbide wafer, the low angle grain boundaries formed by the clustering of the basal plane dislocation defects are less than 30% of the range area.

8. The silicon carbide wafer as claimed in claim 7, wherein within the range area of 20 mm from the edge of the silicon carbide wafer, the low angle grain boundaries formed by the clustering of the basal plane dislocation defects are less than 20% of the range area.

9. The silicon carbide wafer as claimed in claim 7, wherein within the range area of 20 mm from the edge of the silicon carbide wafer, there are no low angle grain boundaries formed by the clustering of the basal plane dislocation defects.

10. The silicon carbide wafer as claimed in claim 1, wherein a density of the basal plane dislocation defects in the silicon carbide wafer is 210 ea/cm$^2$ to 450 ea/cm$^2$.

11. A method of fabricating a silicon carbide wafer, comprising:
   providing a seed crystal, wherein the seed crystal comprises a first surface and a second surface opposite to the first surface;
   using a raw material of silicon carbide powder to contact the seed crystal to perform a crystal growth process, wherein impurity in the silicon carbide powder is less than 0.5 ppm; and
   forming a crystal through the crystal growth process, and slicing the crystal to form the silicon carbide wafer.

12. The method of fabricating the silicon carbide wafer as claimed in claim 11, wherein a difference between numbers of basal plane dislocation defects of the first surface and the second surface in the seed crystal is less than 25%.

\* \* \* \* \*